United States Patent

Kam

[15] 3,671,775

[45] June 20, 1972

[54] PULSE SHAPING CIRCUIT WITH MULTIPLIER APPLICATION

[72] Inventor: George H. Kam, Tonawanda, N.Y.

[73] Assignee: Sylvania Electric Products Inc.

[22] Filed: April 27, 1970

[21] Appl. No.: 32,073

[52] U.S. Cl. ..............................307/271, 331/166, 307/261, 307/268, 328/223

[51] Int. Cl. ..........................................................H03k 1/10

[58] Field of Search..................307/261, 264, 265, 268, 271, 307/234; 328/223; 331/174, 166

[56] References Cited

UNITED STATES PATENTS

| | | | |
|---|---|---|---|
| 2,139,023 | 12/1938 | Kock | 331/174 |
| 2,443,619 | 6/1948 | Hopper | 331/166 |
| 2,897,378 | 7/1959 | Jones, Jr. | 307/261 |
| 3,327,139 | 6/1967 | Hillman | 307/264 |
| 2,675,474 | 4/1954 | Eberhard | 307/261 |
| 2,758,206 | 8/1956 | Hamilton | 307/261 |
| 3,449,656 | 6/1969 | Grieninger | 307/271 |
| 3,210,569 | 10/1965 | Reek | 307/261 |
| 3,292,000 | 12/1966 | Chow | 307/261 |

*Primary Examiner*—Donald D. Forrer
*Assistant Examiner*—R. E. Hart
*Attorney*—Norman J. O'Malley, Elmer J. Nealon and Edward J. Coleman

[57] ABSTRACT

A pulse shaping circuit comprising a series resonant circuit and a shunt resistor-diode damping circuit in combination with a square wave input and a grounded base transistor load to provide a pulse of controlled width and amplitude. The damping circuit dissipates all but the first half cycle of resonant circuit ringing. A dual circuit employs a parallel resonant circuit and common emitter load transistor. In a frequency multiplier application, the resonant circuit is tuned to the desired harmonic frequency and a bandpass filter is connected at the transistor output.

14 Claims, 5 Drawing Figures

INVENTOR
George H. Kam
BY Edward J. Coleman
AGENT.

PULSE SHAPING CIRCUIT WITH MULTIPLIER APPLICATION

BACKGROUND OF THE INVENTION

The invention herein described was made in the course of or under a contract or subcontract thereunder, with the Department of the Army.

This invention relates in general to pulse shaping circuits and in particular to a circuit for generating a pulse of predetermined width and peak amplitude which is particularly useful in a frequency multiplier application.

In portable battery operated electronic equipment, it is of prime importance to obtain maximum efficiency with minimum circuitry. The present invention is found particularly useful in attaining both of these requirements with respect to frequency multipliers wherein a square wave signal is to be multiplied to provide a higher frequency sinusoidal signal. The typical prior art multiplier for such an application comprises an amplifier having a bandpass filter connected in its output circuit and tuned to select a desired harmonic of the fundamental frequency of a square wave input signal applied to the amplifier. In this implementation, the peak and average current through the amplifier are equal during the reference, or "0," state of the input square wave, thereby yielding a relatively low operating efficiency in that there is a poor ratio of desired harmonic energy output with respect to the direct current input power to the amplifier.

SUMMARY OF THE INVENTION

Accordingly, it is an object of the present invention to provide an efficient pulse shaping circuit having a controllable output pulse width.

Another object of the invention is to provide an efficient and relatively simple pulse shaping circuit particularly suitable for frequency multiplier applications.

A further object of the invention is to provide a circuit for generating a pulse having a predetermined fixed width and peak current amplitude.

Yet another object of the invention is to provide an improved frequency multiplier circuit.

Briefly, these objects are attained by a pulse shaping circuit comprising a resonant circuit coupled between signal input means and signal output means. The circuit further includes means responsive to excitation of ringing in the resonant circuit, pursuant to an input signal, for gating a portion of the ringing to the output means. In one aspect of the invention the gating means is operative to pass a pulse comprising the first half cycle of ringing in the resonant circuit, and the damping means is operative to substantially dampen all of the ringing subsequent to the first half cycle thereof.

BRIEF DESCRIPTION OF THE DRAWINGS

This invention will be more fully described hereinafter in conjunction with the accompanying drawings, in which.

DESCRIPTION OF PREFERRED EMBODIMENT

For a better understanding of the present invention together with other and further objects, advantages and capabilities thereof, reference is made to the following disclosure and appended claims in connection with the above-described drawings.

Figures 1, 2:
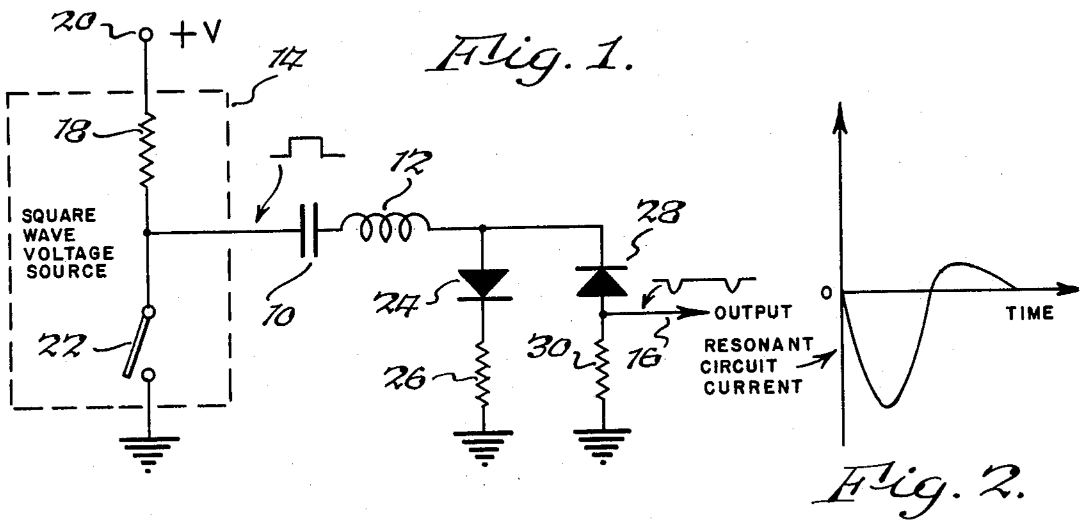
FIG. 1 is a simplified schematic diagram of a pulse shaping circuit according to the invention.
FIG. 2 illustrates the current wave form through the resonant circuit in the pulse shaper of FIG. 1.

FIG. 1 illustrates a simplified embodiment of a pulse shaping circuit according to the invention. A series resonant circuit comprising capacitor 10 and inductor 12 is connected between a signal input means comprising square wave voltage source 14 and signal output means represented by the output line 16. Square wave voltage source 14 is illustrated as comprising a resistor 18 connected between capacitor 10 and a source of positive supply voltage, represented by terminal 20, and a switch 22 connected between the junction of resistor 18 and capacitor 10 and a source of reference potential, or ground. At the output side of the resonant circuit, a diode 24 and resistor 26 are serially connected between inductor 12 and ground, and a diode 28 and load resistor 30 are serially connected in that order between inductor 12 and ground. Diode 24 is oriented with its anode connected to inductor 12, while diode 28 is oriented with its cathode connected to inductor 12. Output line 16 is taken from the junction of diode 28 and resistor 30. Resistor 26 is selected to have a relatively high value of resistance so that upon conduction of diode 24, a relatively high load impedance is connected at the output of the resonant circuit. In this manner, resistor 26 functions as a switch controlled damping resistor for the resonant circuit 10, 12. Resistor 30, on the other hand, is selected to have a relatively low value, such that upon conduction of diode 28 a relatively low input impedance is presented to the resonant circuit.

In operation, with switch 22 in the normally open state, the source of positive supply voltage from terminal 20 is applied via resistor 18 to capacitor 10 so that capacitor 10 is charged via inductor 12, conducting diode 24 and damping resistor 26. Diode 28 is reverse biased to thereby block conduction to output line 16 during the period that a charge is building up on capacitor 10.

Actuation of switch 22 to the closed position short circuits resistor 18 to ground and thereby causes the output of voltage source 14 to drop to zero. This change of state of the input signal is operative to initiate discharge of capacitor 10, whereupon the energy stored in the capacitor as a voltage is transferred to inductor 12 as a current. Actually, the negative going input signal change of state and resulting capacitor discharge excites ringing in the resonant circuit at a frequency to which the circuit is tuned by the selected values of capacitor 10 and inductor 12. The first half cycle of resonant circuit ringing current is negative going, as illustrated in FIG. 2, whereupon diode 24 is reverse biased to be nonconducting and diode 28 is forward biased into conduction. As a consequence, diode 28 is responsive to the excitation of ringing in the resonant circuit to gate the first half cycle of ringing current through load resistor 30, which provides the desired low impedance input for gating means 28. The gated current through resistor 30 produces an output voltage pulse on line 16. It will be noted that during the conducting period of diode 28, a series RLC network is formed by resistor 30, inductor 12 and capacitor 10.

After the first half cycle of ringing is completed, the current in the resonant circuit tends to go positive, as illustrated in FIG. 2. Diode 28 is thereupon reverse biased to block any further conduction to resistor 30 and output line 16, and diode 24 is forward biased to connect the high impedance damping resistor 26 in series with resonant circuit 10, 12 to dissipate the remainder of energy stored in the resonant circuit. In this manner, the circuit formed by diode 24 and resistor 26 is operative in response to resonant circuit ringing to substantially dampen all of the ringing subsequent to the first half cycle. FIG. 2 illustrates this damping effect subsequent to the first negative half cycle of current.

If the positive output of voltage source 14 during the open position of switch 22 is referred to as the binary "1" state, the output of the voltage source when switch 22 is closed may be referred to as the binary "0" state. From the foregoing description, it is clear that each "1" to "0" state transition of the input voltage to the pulse shaping circuit will cause a single negative going pulse to be produced on output line 16. The duration, or width, of this pulse is determined by the ringing frequency of the resonant circuit, which in turn is determined by the selected values of capacitor 10 and inductor 12. That is, the frequency of resonance to which circuit 10, 12 is tuned determines the period of the first half cycle of ringing, which in effect is the output pulse width. Thus, regardless of variations in the pulse width of input signal square waves caused by successive opening and closing of switch 22, the resulting output pulses on line 16 will always have a fixed width $T$, which may be expressed as $$T=\pi\sqrt{LC}$$

where $L$ is the value of inductor 12 and $C$ is the value of capacitor 10. The shape of the current pulse through load resistor 30 will be a half sine wave having a determinable peak amplitude $i_{max}$, which may be expressed as $$i_{max}\approx v\sqrt{C/L}$$

where $v$ is the voltage initially across capacitor 10 as determined by the amplitude of the input square wave or transition, $C$ is the value of capacitor 10, and $L$ is the value of inductor 12. The value of load resistor 30 is much less than the reactances of $L$ and $C$ which are equal at their resonant frequency and therefore has not been included in the $i_{max}$ expression.

Figure 3:
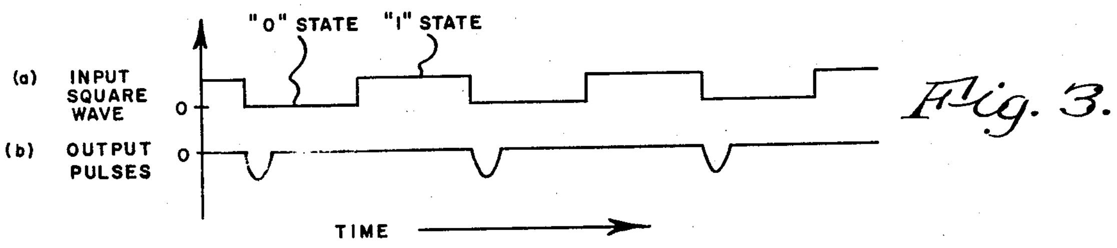
FIG. 3 is a wave form diagram illustrating the input and output signals of the pulse shaping circuit of FIG. 1 during normal operation.

If switch 22 is periodically open and closed at a fixed rate, the result will be a train of square waves at a given pulse repetition frequency, as illustrated in wave form (*a*) of FIG. 3. The upper, or "1" state, level of the square wave being the open switch condition, and the lower, or "0" state, level being the closed switch condition. The amplitude of this square wave may be predetermined by the supply voltage applied at terminal 20 and the value of resistor 18. In this manner, the pulse shaping circuit of FIG. 1 will be operative in response to the input square wave of FIG. 3 to produce a train of half sinusoid output pulses on line 16, as illustrated by wave form (*b*) in FIG. 3. The train of wave form (*b*) output pulses will occur at the pulse repetition frequency of the input signal and have a predetermined fixed pulse width and peak amplitude as described above.

Figures 4, 5:
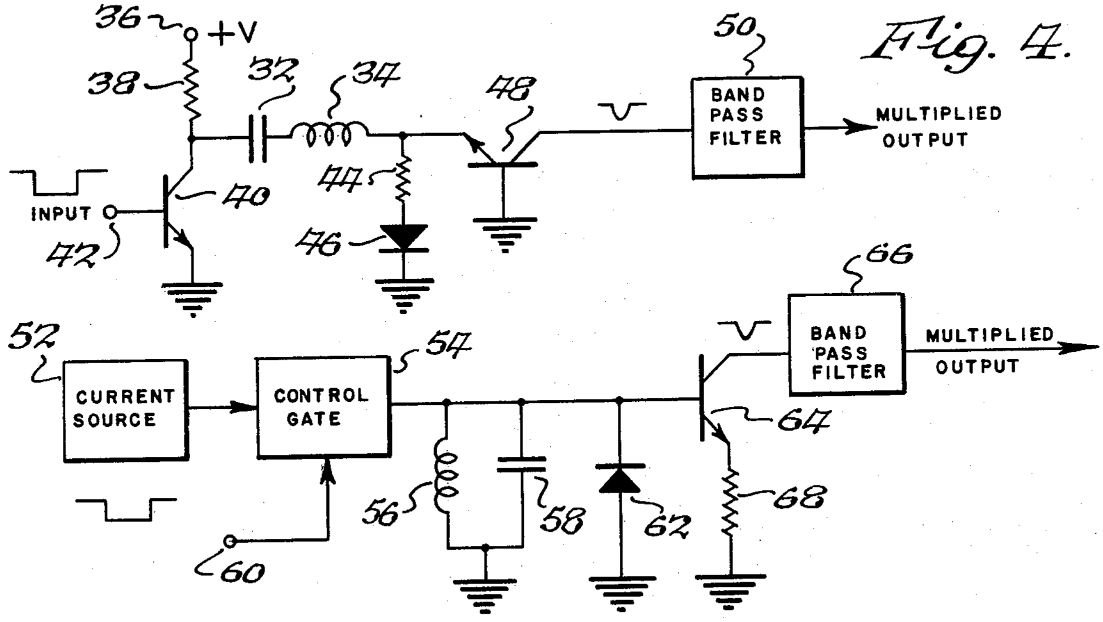
FIG. 4 is a combined schematic and block diagram of an implementation of the pulse shaping circuit of FIG. 1 in a frequency multiplier application.
FIG. 5 is a combined schematic and block diagram of an alternative embodiment of the invention, representing a dual of the circuit of FIG. 4, in a frequency multiplier application.

These controlled output pulse characteristics make the FIG. 1 pulse shaping circuit particularly suitable for frequency multiplier applications. Accordingly, FIG. 4 shows an embodiment of the pulse shaping circuit combined with a bandpass filter to provide a frequency multiplier in accordance with the invention. The series resonant circuit comprises capacitor 32 and inductor 34, and the signal input means includes a positive direct current voltage source, represented by terminal 36, connected to capacitor 32 via resistor 38 for normally supplying voltage to the series resonant circuit. A transistor amplifier 40, connected between the junction of resistor 38 and capacitor 32 and ground, functions as a pulse responsive means for interrupting the supply of voltage from terminal 36 to thereby excite the resonant circuit into ringing. More specifically, transistor 40 has a collector electrode connected to the junction of resistor 38 and capacitor 32, an emitter electrode connected to ground and a base electrode connected to a pulse input terminal 42 to which a square wave input signal is applied.

The switch controlled high impedance damping circuit comprises a resistor 44 and diode 46 serially connected in that order between the output side of inductor 34 and ground. Diode 46 is oriented so that its cathode terminal is grounded. The output gating means comprises a grounded base transistor amplifier 48 connected between the output side of inductor 34 and a band pass filter 50. The emitter of transistor 48 is connected to the junction of inductor 34 and resistor 44; its base electrode is connected to ground; and the collector of transistor 48 is connected as the amplifier output to band pass filter 50.

Assume that the given design parameters provide that a square wave pulse train at frequency $f$ is to be applied to input terminal 42 for multiplication to a frequency $nf$, where $n$ is an integer. The circuit comprising voltage source terminal 36, resistor 38 and transistor 40 will thereupon function as a square wave voltage source operative to apply a square wave of frequency $f$ to the series resonant circuit 32, 34. Preferably, amplifier 40 is operated at saturation such that the square wave applied to the resonant circuit has a fixed amplitude determined by the voltage level at terminal 36 and resistor 38. The values of capacitor 32 and inductor 34 are selected such that the resonant circuit is tuned to resonance at the frequency $nf$, where $n$ is an integer. In this manner, regardless of variations in the pulse symmetry of the input square wave, the excited resonant frequency ringing of circuit 32, 34 will have the predetermined half cycle period of $1/2nf$, which is equal to $\pi\sqrt{LC}$.

Hence, during the relatively negative period of the square wave applied to input terminal 42, transistor 40 will be biased to cutoff such that a "1" state positive level of voltage is applied to the resonant circuit from supply terminal 36. Capacitor 32 is thereupon charged via diode 46, resistor 44, inductor 34, and resistor 38. Thereafter, in response to the positive going transition of the signal applied at input terminal 42, transistor 40 conducts to saturation to short the input side of capacitor 32 to ground. This represents a "1" to "0" state voltage transition at the input of the resonant circuit, whereby capacitor 32 is caused to discharge and excite ringing in the resonant circuit. As the series resonant circuit 32, 34 is tuned to resonance at the desired multiple of the input frequency represented by $nf$, the ringing in the resonant circuit will have a fixed predetermined half cycle period of $1/2nf$, regardless of symmetry variations in the input square wave.

The first half cycle of ringing will comprise a negative going current pulse as illustrated in FIG. 2, whereupon diode 46 is reverse biased and transistor 48 is biased into conduction. During conduction, grounded base amplifier 48 presents a relatively low input impedance to the resonant circuit. At the commencement of the second half cycle of ringing, the positive going tendency of the current through the resonant circuit (see FIG. 2) causes the base-emitter junction of transistor 48 to be reverse biased, thereby rendering the amplifier nonconducting. Diode 46 is forward biased into conduction at this time to thereby connect the high impedance damping resistor 44 in series with the ringing circuit to dissipate the remaining energy in resonant circuit 32, 34.

As illustrated in the wave forms of FIG. 3, this operation provides an output pulse from gating transistor 48 in response to each "1" to "0" state transition of the square wave applied to the resonant circuit. Of more particular interest, however, this output pulse has a fixed pulse width, or period, of $1/2nf$ and a fixed peak current amplitude of $v\sqrt{C/L}$, where $v$ is substantially determined by the amplitude of the square wave applied to the resonant circuit, $C$ is the capacitance value of capacitor 32 and $L$ is the inductance of inductor 34. Filter 50 is a conventional bandpass filter designed to produce a sinusoidal output signal having a frequency $nf$ in response to being activated by an input pulse having a period of $1/2nf$. Hence, the circuit of FIG. 4 comprises a frequency multiplier operative in response to an input square wave to produce an output sine wave having a frequency multiplied by a factor of $n$.

For such a frequency multiplier application, it is desirable to choose a peak current amplitude $i_{max}$ for the output pulse which is large enough (by selection of $v$, $L$ and $C$) to drive gating transistor 48 into limiting. This mode of operation yields a relatively constant filtered output over relatively wide variations in temperature, dependent only upon power supply regulation. When employing this limiting feature of operation, the output pulse width should be slightly narrower; this may be achieved by selecting capacitor 32 and inductor 34 to resonate at a frequency slightly higher than the selected harmonic output $nf$ from filter 50.

Similar results may be achieved by an alternative embodiment of the invention shown in FIG. 5, which comprises the dual of the circuit of FIG. 4. In FIG. 5, the signal input means comprises a square wave current source; a parallel resonant circuit tuned to antiresonance at *nf* is employed; damping is provided by a low impedance load; and the output gating means presents a relatively high input impedance. The signal input means comprises a current source 52 having an output control gate 54, such as a base controlled transistor, through which a current is normally supplied to a parallel resonant circuit comprising inductor 56 and capacitor 58. Gate 54 is responsive to input square wave pulses applied via control terminal 60 to interrupt the supply of current to the parallel resonant circuit and thereby excite the parallel resonant circuit into ringing. Switch controlled damping of the parallel resonant circuit is provided by a low impedance diode 62, which is connected across the parallel resonant circuit 56, 58 with its anode connected to ground. The output gating means comprises a common emitter transistor amplifier 64 connected between the resonant circuit and an output bandpass filter 66. More specifically, transistor 64 has a collector electrode connected as the amplifier output to filter 66, an emitter electrode connected through a resistor 68 to ground, and a base electrode connected to the junction of the cathode of diode 62, capacitor 58, inductor 56 and the output of gate 54. Use of the degeneration resistor 68 is optional dependent upon gain required from transistor 64.

In operation, when control gate 54 is closed such that current flows through to the parallel resonant circuit (this may be considered the "1" state of the input current square wave) inductor 56 stores the applied current; the lack of voltage drop across inductor 56 maintains diode 62 in a nonconducting state; and transistor 64 will be biased to cutoff. Upon the opening of gate 54 in response to the input control signal at terminal 60, the resulting interruption in the current supply causes a transition in the input current square wave from the "1" state to the "0" state. This transition excites the parallel resonant circuit into ringing at the antiresonance frequency to which the circuit is tuned by the selection of inductor 56 and capacitor 58. In this instance, the first half cycle of ringing is positive going as a result of the charge build up on capacitor 58 by the current stored in inductor 56. The positive going first half cycle of ringing reverse biases diode 62 to the nonconducting state and forward biases the base-emitter junction of transistor 64. The transistor thereupon conducts, with the high input impedance typical of a common emitter stage, to amplify the first half cycle pulse and apply it to bandpass filter 66.

The negative going second half cycle of ringing current biases transistor 64 to cutoff and forward biases diode 62 to thereby connect a low impedance path across parallel resonant circuit 56, 58. The low impedance of conducting diode 62 is thereupon operative to dissipate the remaining energy in the antiresonant circuit, and thereby substantially dampen all ringing subsequent to the first half cycle.

If the frequency of the input signal square wave pulse train is *f*, a multiplied output frequency of *nf* is provided by tuning circuit 56, 58 to antiresonance at a frequency of *nf* and designing the bandpass filter to produce a *nf* sine wave in response to the gating of a pulse from amplifier 64 having a period of $1/2nf$.

In summary, a relatively simple and economical pulse shaping circuit has been provided for obtaining maximum efficiency with minimum circuitry, wherein pulse width and amplitude design is controllable. These features are attained by employing a controlled amplitude square wave to excite a resonant circuit having an output gate, responsive to the excitation to pass as the controlled output pulse the first half cycle of ringing, and a damping circuit operative to dissipate the ringing energy after the first half cycle. When combined with an output bandpass filter, the circuit provides optimum frequency multiplication.

It is to be understood, however, that the circuit is not limited to frequency multiplier applications. For example, controlled pulse shaping circuit of the invention is also quite suitable for use in a digital sample and hold phase detector. In such phase detectors, a first input signal pulse train is applied to a ramp generator to be converted to a sawtooth, or ramp, wave form, which is applied to a series switch periodically sampled by a second input pulse train. A holding capacitor is connected at the output of the series switch for storing the sampled ramp values. If there is no change in relative phase at successive sampling times, the output of the phase detector will not change. If, however, there is a phase difference between samples, the output capacitor voltage shifts abruptly up or down to a new value. Clearly, the pulse width and amplitude of the two input pulse trains to the phase detector are quite critical to proper operation. Accordingly, the pulse shaping circuit of the invention is particularly suitable for driving the ramp generator and sampling gate of the described digital phase detector.

In addition, the pulse shaping circuit could be used as a monostable in low duty cycle applications where pulse width accuracy is of major concern.

While a particular embodiment of the invention has been illustrated, it will be understood that the applicant does not wish to be limited thereto since modifications will now be suggested to one skilled in the art. For example, the square wave voltage or current sources may be implemented in any one of a variety of well known ways. The resonant circuits may be variable rather than fixed tuned. Polarities and power supplies may be reversed. The high impedance damping circuits employed in the FIG. 1 and FIG. 4 implementations need not employ a damping resistor if the diode resistance is sufficiently high. Control of the damping circuits may be provided by voltage or current responsive switching means other than a diode, and output gating may be provided by means other than the illustrated diode 28 and transistor amplifiers 48 and 64.

What is claimed is:

1. A pulse shaping circuit comprising, in combination, signal input means, a resonant circuit coupled to said input means, signal output means, gating means responsive to the excitation of ringing in said resonant circuit by an input signal for gating a pulse comprising the first half cycle of said ringing to said output means, and damping means responsive to said ringing for substantially damping all of said ringing subsequent to the first half cycle thereof.

2. A pulse shaping circuit according to claim 1 wherein said signal input means comprises means for generating a square wave signal of predetermined amplitude.

3. A pulse shaping circuit according to claim 1 wherein said resonant circuit comprises a series resonant circuit tuned to resonance at a frequency having a predetermined half cycle period.

4. A pulse shaping circuit according to claim 3 wherein said signal input means comprises means for normally supplying a voltage to said series resonant circuit and pulse responsive means for interrupting said supply of voltage to said resonant circuit whereby said resonant circuit is excited into ringing.

5. A pulse shaping circuit according to claim 3 wherein said gating means has a low input impedance during the gating of the first half cycle of said ringing to said output means, and said damping means comprises a switch controlled high impedance circuit, said high impedance circuit being connected as the load for said series resonant circuit in response to said ringing and subsequent to the first half cycle thereof.

6. A pulse shaping circuit according to claim 5 wherein said damping means comprises a diode and damping resistor serially connected between the output of said series resonant circuit and a source of reference potential.

7. A pulse shaping circuit according to claim 5 wherein said gating means comprises an amplifier connected between the output of said series resonant circuit and said signal output means.

8. A pulse shaping circuit according to claim 7 wherein said signal input means comprises a square wave voltage source operative to apply a square wave of frequency *f* to said series resonant circuit, said signal output means includes a filter connected to the output of said amplifier for producing an output signal of frequency *nf*, where *n* is an integer, in response to the gating of a pulse from said amplifier having a period of 1/2*nf*, and said series resonant circuit is tuned to resonance at the frequency *nf*, said pulse shaping circuit thereby comprising a frequency multiplier.

9. A pulse shaping circuit according to claim 1 wherein said resonant circuit comprises a parallel resonant circuit tuned to antiresonance at a frequency having a predetermined half cycle period.

10. A pulse shaping circuit according to claim 9 wherein said signal input means comprises means for normally supplying current to said parallel resonant circuit and pulse responsive means for interrupting said supply of current to said parallel resonant circuit whereby said parallel resonant circuit is excited into ringing.

11. A pulse shaping circuit according to claim 9 wherein said gating means has a high input impedance during the gating of the first half cycle of said ringing to said output means, and said damping means comprises switching means for connecting a low impedance load to said parallel resonant circuit in response to said ringing and subsequent to the first half cycle thereof.

12. A pulse shaping circuit according to claim 11 wherein said damping means comprises a diode connected across said parallel resonant circuit.

13. A pulse shaping circuit according to claim 11 wherein said gating means comprises an amplifier connected between said parallel resonant circuit and said output means.

14. A pulse shaping circuit according to claim 13 wherein said signal input means comprises a square wave current source operative to apply a square wave of frequency *f* to said parallel resonant circuit, said signal output means includes a filter connected to the output of said amplifier for producing an output signal of frequency *nf*, where *n* is an integer, in response to the gating of a pulse from said amplifier having a period of 1/2*nf*, and said parallel resonant circuit is tuned to antiresonance at the frequency *nf*, said pulse shaping circuit thereby comprising a frequency multiplier.

* * * * *